US011448905B2

(12) United States Patent
Onoe

(10) Patent No.: US 11,448,905 B2
(45) Date of Patent: Sep. 20, 2022

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventor: Kazuyuki Onoe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 309 days.

(21) Appl. No.: 16/629,694

(22) PCT Filed: Nov. 17, 2017

(86) PCT No.: PCT/JP2017/041528
§ 371 (c)(1),
(2) Date: Jan. 9, 2020

(87) PCT Pub. No.: WO2019/097687
PCT Pub. Date: May 23, 2019

(65) Prior Publication Data
US 2020/0333638 A1     Oct. 22, 2020

(51) Int. Cl.
*G02F 1/015* (2006.01)
(52) U.S. Cl.
CPC ............ *G02F 1/015* (2013.01); *G02F 1/0157* (2021.01); *G02F 2201/12* (2013.01)
(58) Field of Classification Search
CPC ...... G02F 1/015; G02F 1/0157; H01L 21/311; H01L 21/31105; H01L 21/31111;
(Continued)

(56) References Cited

U.S. PATENT DOCUMENTS 5,825,797 A   10/1998  Nagai
6,072,818 A   6/2000   Hayakawa
(Continued)

FOREIGN PATENT DOCUMENTS

JP   H09266352 A   10/1997
JP   H09283839 A   10/1997
(Continued)

OTHER PUBLICATIONS

ISRInternational Search Report; Written Opinion; and Notification of Transmittal of the International Search Report and the Written Opinion of the International Searching Authority, or the Declaration issued in PCT/JP2017/041528; dated Jan. 30, 2018.
(Continued)

*Primary Examiner* — Angela K Davison
(74) *Attorney, Agent, or Firm* — Studebaker & Brackett PC

(57) ABSTRACT

A semiconductor device according to the present invention includes a substrate, an active layer provided on the substrate, a cladding layer provided on the active layer, a contact layer provided on the cladding layer, the contact layer having an upper surface, a back surface which is a surface on an opposite side to the upper surface, and a side surface connecting the upper surface and the back surface, the contact layer is larger in width than the cladding layer; and an electrode that is in contact with the upper surface of the contact layer and the side surface of the contact layer from an upper end to a lower end of the side surface of the contact layer.

8 Claims, 4 Drawing Sheets

(58) Field of Classification Search
CPC .... H01L 21/31116; H01S 5/02; H01S 5/0207; H01S 5/0208
See application file for complete search history.

(56) References Cited

U.S. PATENT DOCUMENTS

| | | |
|---|---|---|
| 2002/0025664 A1 | 2/2002 | Wakejima et al. |
| 2003/0179794 A1 | 9/2003 | Mihashi et al. |
| 2004/0240503 A1 | 12/2004 | Fukai et al. |
| 2006/0131593 A1 | 6/2006 | Fukai et al. |
| 2006/0280215 A1 | 12/2006 | Son et al. |
| 2008/0293176 A1 | 11/2008 | Oka et al. |

FOREIGN PATENT DOCUMENTS

| | | |
|---|---|---|
| JP | 2001284734 A | 10/2001 |
| JP | 2003046193 A | 2/2003 |
| JP | 2004104073 A | 4/2004 |
| JP | 2007214570 A | 8/2007 |
| JP | 2009016389 A | 1/2009 |
| TW | 557619 B | 10/2003 |
| TW | 200903936 A | 1/2009 |

OTHER PUBLICATIONS

Office Action issued in TW 106145513; mailed by the Taiwanese Patent Office dated Jul. 12, 2018.
Office Action issued in JP 2018-521675; mailed by the Japanese Patent Office dated Jul. 3, 2018.

SEMICONDUCTOR DEVICE AND METHOD FOR MANUFACTURING SEMICONDUCTOR DEVICE

FIELD

The present invention relates to a semiconductor device and a method for manufacturing the semiconductor device.

BACKGROUND

Patent Literature 1 discloses a semiconductor laser device including an active layer provided on a semiconductor substrate, a cladding layer provided on the active layer, and a ridge having a contact layer provided on the cladding layer. In this semiconductor laser device, a side surface of the cladding layer is covered with an insulating film. An electrode is connected to the contact layer. In the insulating film, an end portion in a thickness direction of the ridge is located between an upper surface and a lower surface of the contact layer. Such a configuration makes it possible to completely cover the side surface of the cladding layer with the insulating film. Moreover, an electrode can be connected to an entire upper surface of the contact layer. Accordingly, it is possible to provide a semiconductor laser device that achieves both reduction in contact resistance and thermal resistance and high reliability.

CITATION LIST

Patent Literature

[PTL 1] JP 2004-104073 A

SUMMARY

Technical Problem

Optical semiconductor devices include, for example, a semiconductor light emitting device such as a semiconductor laser, a semiconductor light receiving device such as a photodiode, and a semiconductor optical modulator in which light emission and light reception are combined. In general, these optical semiconductor devices are used as a light source for optical communication or a light source for information equipment. Therefore, it may be required to increase the speed of optical communication of the optical semiconductor devices.

In order to increase the data transfer rate, it may be considered to reduce a parasitic capacitance by reducing the ridge width of an optical semiconductor device. Here, in Patent Literature 1, the electrode is connected to the entire upper surface of the contact layer. In this case, in order to prevent increase of the contact resistance, it is necessary to maintain the area of the upper surface of the contact layer even if the ridge width is reduced. Therefore, when the ridge width is reduced, a portion of the contact layer that protrudes from the upper surface of the ridge becomes longer. Therefore, the structure of the optical semiconductor device may be destabilized.

Furthermore, in Patent Literature 1, a contact layer having an inverted mesa shape is formed by wet etching. In this case, for example, in order to double the length of the portion of the contact layer which protrudes from the upper surface of the ridge, it is considered that the thickness of the contact layer is required to be doubled. Therefore, the production capacity of an epitaxial apparatus for epitaxially growing the contact layer may be deteriorated to ½. Furthermore, it is considered that stress concentration occurs at a base portion of the contact layer due to increase in the contact layer thickness. Accordingly, there is a concern about deterioration in reliability. From the foregoing, in the structure of Patent Literature 1, it may be difficult to reduce the contact resistance as the speed increases.

The present invention has been made to solve the above-described problems, and has an object to obtain a semiconductor device and a method for manufacturing the semiconductor device that achieve both reduction in contact resistance and thermal resistance and high reliability.

Solution to Problem

A semiconductor device according to the present invention includes a substrate, an active layer provided on the substrate, a cladding layer provided on the active layer, a contact layer provided on the cladding layer, the contact layer having an upper surface, a back surface which is a surface on an opposite side to the upper surface, and a side surface connecting the upper surface and the back surface, the contact layer is larger in width than the cladding layer; and an electrode that is in contact with the upper surface of the contact layer and the side surface of the contact layer from an upper end to a lower end of the side surface of the contact layer.

A method for manufacturing a semiconductor device according to the present invention includes the steps of forming an active layer on a substrate, forming a cladding layer on the active layer, forming a contact layer on the cladding layer, the contact layer having an upper surface, a back surface which is a surface on an opposite side to the upper surface, and a side surface connecting the upper surface and the back surface, the contact layer being larger in width than the cladding layer and forming an electrode by electroless plating in such a manner that the electrode contacts the upper surface, the side surface and the back surface of the contact layer.

Advantageous Effects of Invention

In the semiconductor device according to the invention of the present application, the electrode covers the upper surface of the contact layer and covers the side surface of the contact layer from the upper end to the lower end of the side surface. Therefore, the contact area between the electrode and the contact layer can be increased as compared with a case where the electrode is provided on the upper surface of a contact layer. Accordingly, the contact resistance and the thermal resistance can be reduced. In addition, since the contact area between the electrode and the contact layer can be increased without increasing the length of a portion protruding from the upper surface of the ridge, it is possible to prevent destabilization of the structure of the semiconductor device. Accordingly, it is possible to achieve both reduction in contact resistance and thermal resistance and high reliability.

In the method for manufacturing a semiconductor device according to the invention of the present application, the electrode is provided so as to contact the upper surface, the side surface, and the back surface of the contact layer by electroless plating. Therefore, the contact area between the electrode and the contact layer can be increased as compared with a case where the electrode is provided on the upper surface of the contact layer. Accordingly, the contact resistance and the thermal resistance can be reduced. In addition, since the contact area between the electrode and the contact layer can be increased without increasing the length of the portion protruding from the upper surface of the ridge, it is possible to prevent destabilization of the structure of the semiconductor device. Therefore, it is possible to achieve both reduction in contact resistance and thermal resistance and high reliability.

DESCRIPTION OF EMBODIMENTS

Figure 1:
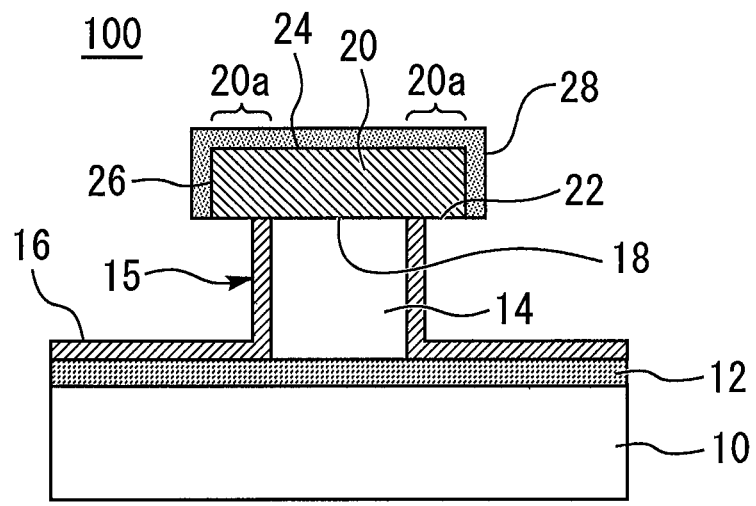
FIG. 1 is a cross-sectional view of a semiconductor device according to a first embodiment.

A semiconductor device and a method for manufacturing the semiconductor device according to an embodiment of the present invention are described with reference to drawings. Identical or corresponding constitutional elements are given the same reference numerals, and the repeated description of such constitutional elements may be omitted.

First Embodiment

FIG. 1 is a cross-sectional view of a semiconductor device 100 according to a first embodiment. The semiconductor device 100 is an optical semiconductor device. The semiconductor device 100 is, for example, a modulator unit of a semiconductor optical modulator. The semiconductor device 100 includes a substrate 10. The substrate 10 is made of n-InP, for example.

An active layer 12 is provided on the substrate 10. The active layer 12 is made of i-InGaAsP, for example. In the semiconductor optical modulator, the active layer 12 absorbs light emitted from a laser unit. When a voltage is applied, the active layer 12 absorbs light emitted from the laser unit due to a Stark effect. The semiconductor device 100 is a direct modulation type modulator unit. The semiconductor device 100 adjusts the magnitude of an optical signal in an optical communication system.

A cladding layer 14 is provided on the active layer 12. The cladding layer 14 is made of p-InP, for example. The cladding layer 14 is smaller in width than the substrate 10 and the active layer 12. The semiconductor device 100 has a ridge 15. The ridge 15 is configured by a cladding layer 14. A portion of the active layer 12 at which the ridge 15 is provided serves as a light emitting region of the semiconductor device 100. The ridge 15 defines the light emitting region. The ridge 15 is provided in the form of a stripe along an optical axis direction which is a light propagation direction. The width of the ridge 15 is equal to 2 μm, for example.

A side surface of the cladding layer 14 is covered with an insulating film 16. The insulating film 16 is made of $SiO_2$, for example. An upper end of the insulating film 16 is provided at the same height as an upper surface 18 of the cladding layer 14. The insulating film 16 covers a portion of the upper surface of the active layer 12, which is not provided with the cladding layer 14.

A contact layer 20 is provided on the cladding layer 14. The contact layer 20 is made of p-InGaAs, for example. The contact layer 20 is a p-type layer doped with Zn. The contact layer 20 includes an upper surface 24, a back surface 22 which is a surface on an opposite side to the upper surface 24, and a side surface 26 which connects the upper surface 24 and the back surface 22. The side surface 26 extends along the optical axis. The contact layer 20 is larger in width than the cladding layer 14. The contact layer 20 has an overhang portion 20a which overhangs from the upper surface 18 of the cladding layer 14. The overhang portion 20a overhangs in a direction perpendicular to the optical axis. In addition, the overhang portion 20a overhangs in a direction parallel to the upper surface of the substrate 10.

In the present embodiment, the contact layer 20 has a rectangular cross-section. The width of the back surface 22 of the contact layer 20 is larger than the width of the upper surface 18 of the cladding layer 14. The back surface 22 of the contact layer 20 is flat and parallel to the upper surface of the substrate 10. The thickness of the contact layer 20 is equal to 1 μm, for example.

An electrode 28 is connected to the contact layer 20. The electrode 28 is made of Ti and Au, for example. In the electrode 28, Ti and Au are laminated. The electrode 28 is in contact with the upper surface 24 of the contact layer 20. Furthermore, the electrode 28 is in contact with the side surface 26 of the contact layer 20 from the upper end to the lower end of the side surface 26. The electrode 28 is in contact with the entire surface of the upper surface 24 of the contact layer 20 and the entire surface of the side surface 26 of the contact layer 20.

Figure 2:
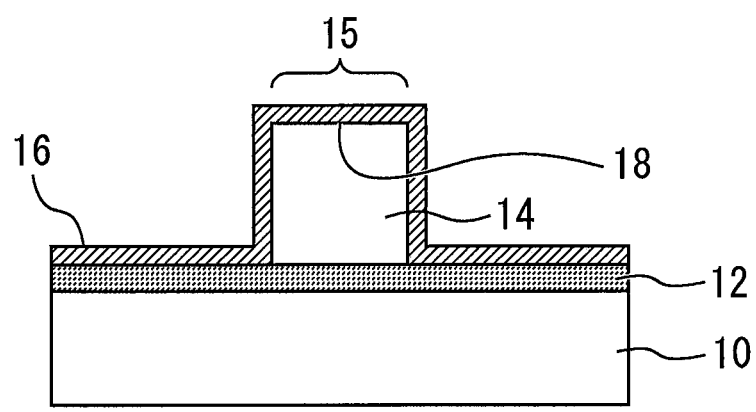
FIG. 2 is a cross-sectional view showing the method for manufacturing the semiconductor device according to the first embodiment.

Next, a method for manufacturing the semiconductor device 100 will be described. FIG. 2 is a cross-sectional view showing the method for manufacturing the semiconductor device 100 according to the first embodiment. First, the active layer 12 is formed on the substrate 10. The active layer 12 is grown on the upper surface of the substrate 10 by using an MOCVD (Metal Organic Chemical Vapor Deposition) method. Next, the cladding layer 14 is formed on the active layer 12. The cladding layer 14 is grown on the upper surface of the active layer 12 by using the MOCVD method.

Next, the ridge 15 is formed. The ridge 15 is obtained by growing the cladding layer 14 and then removing a part of the cladding layer 14 by using a dry etching method. Dry etching is performed by using a mixed gas of $SiCl_4$ and Ar.

Next, the insulating film 16 is formed as shown in FIG. 2. The insulating film 16 is formed by using a plasma CVD (Chemical Vapor Deposition) method. The insulating film 16 is formed so as to cover the upper surface 18 and side surface of the cladding layer 14 and the upper surface of the active layer 12.

Figure 3:
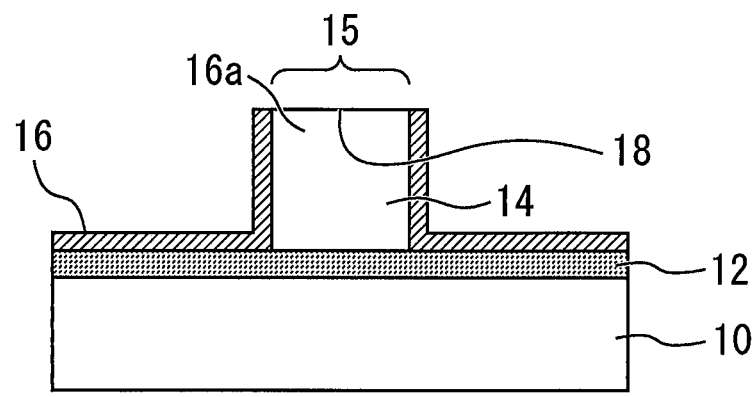
FIG. 3 is a cross-sectional view showing a state in which the upper surface of the cladding layer is exposed.

Next, an opening is formed in the insulating film 16 by a transfer process. The opening exposes the entire surface of the upper surface 18 of the cladding layer 14 therethrough. FIG. 3 is a cross-sectional view showing a state in which the upper surface 18 of the cladding layer 14 is exposed. In the transfer process, a resist is first formed on the insulating film 16. Next, an opening is formed in a portion of the resist which is provided on the cladding layer 14. Next, dry etching is performed by using the resist as a mask. Dry etching is performed by using SF6 gas. As a result, a portion of the insulating film 16 which is provided on the upper surface 18 of the cladding layer 14 is selectively removed. In the way described above, an opening 16a is formed in the insulating film 16.

Figure 4:
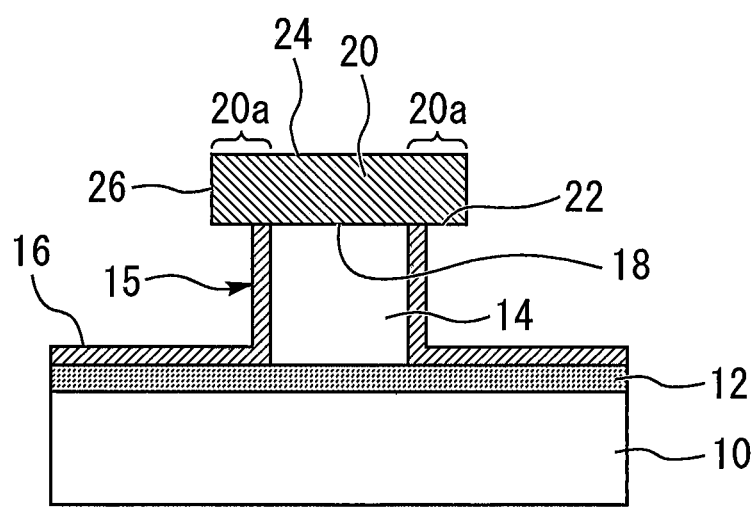
FIG. 4 is a cross-sectional view showing a state in which the contact layer is formed.

Next, the contact layer 20 is formed on the cladding layer 14. FIG. 4 is a cross-sectional view showing a state in which the contact layer 20 is formed. Here, by using the MOCVD method, the contact layer 20 is selectively grown on the upper surface 18 of the cladding layer 14 which is exposed through the opening 16a. In the selective growth, the insulating film 16 is used as a mask.

At this time, a growth time is adjusted so that the overhang portion 20a is formed. The overhang portion 20a is formed by extending the growth time. ELO (Epitaxial Lateral Overgrowth) for growing crystal in a lateral direction may be used as a method for forming the overhang portion 20a. Alternatively, masks for supporting the overhang portion 20a may be formed on both sides of the cladding layer 14, and the contact layer 20 may be formed on the masks.

Next, the electrode 28 is formed. The electrode 28 is formed by a vapor deposition lift-off method. The electrode 28 is formed so as to cover the upper surface 24 of the contact layer 20 and the side surface 26 from the upper end to the lower end of the side surface 26. Next, the electrode 28 is heated to be thermally reacted with the contact layer 20. The electrode 28 is heated to 400° C., for example. As a result, an ohmic junction is formed between the electrode 28 and the contact layer 20. As a result, the semiconductor device 100 is formed.

Next, effects of the present embodiment will be described. In the present embodiment, the electrode 28 covers the upper surface 24 of the contact layer 20 and the side surface 26 of the contact layer 20 from the upper end to the lower end of the side surface 26. Therefore, as compared with a case where the electrode 28 is provided only on the upper surface 24 of the contact layer 20, the contact area between the electrode 28 and the contact layer 20 can be increased. Accordingly, the contact resistance that is the resistance between the contact layer 20 and the electrode 28 can be reduced. Therefore, the impedance of the semiconductor device 100 can be reduced. In addition, the thermal resistance between the contact layer 20 and the electrode 28 can be reduced.

It is also considered that the ridge width is reduced in order to reduce the parasitic capacitance of the optical semiconductor device. At this time, by adopting the structure of the present embodiment, the contact area between the electrode 28 and the contact layer 20 can be secured to be large even when the width of the ridge 15 is reduced. Therefore, in order to prevent increase of the contact resistance, it is not necessary to lengthen the overhang portion 20a. Accordingly, destabilization of the structure of the semiconductor device 100 can be prevented, and reliability can be improved.

In the present embodiment, the contact resistance can be reduced while avoiding such an unstable structure as impairing the reliability, and the semiconductor device 100 is enabled to respond at high speed. Therefore, it is possible to stably increase the speed of the optical communication system in which the semiconductor device 100 is installed.

These effects will be specifically described. In general, the contact resistivity can be lowered by increasing the carrier concentration of the contact layer. However, in general, there is a limit to reduction of the contact resistivity only by increasing the carrier concentration. For this reason, it is considered that the contact area between the electrode and the contact layer is increased to reduce the contact resistance. As means for this, the area of the upper surface of the contact layer may be increased.

Figure 6:
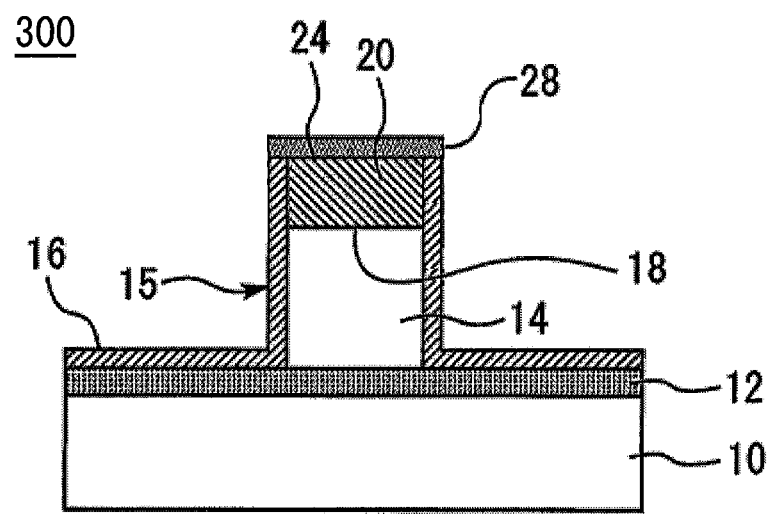
FIG. 6 is a cross-sectional view of a semiconductor device according to a first comparative example.
Figure 7:
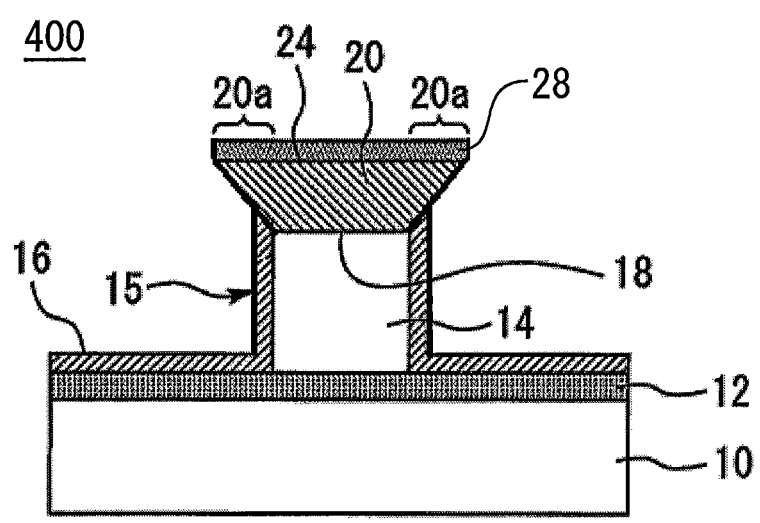
FIG. 7 is a cross-sectional view of a semiconductor device according to a second comparative example.

FIG. 6 is a cross-sectional view of a semiconductor device 300 according to a first comparative example. As the first comparative example, a ridge type laser which is generally used in optical communication is considered. FIG. 7 is a cross-sectional view of a semiconductor device 400 according to a second comparative example. In the second comparative example, the contact layer 20 having an inverted mesa shape is formed by wet etching. In the first and second comparative examples, the electrode 28 is provided only on the upper surface 24 of the contact layer 20. In the first and second comparative examples, the width of the ridge 15 is set to 2 µm, and the thickness of the contact layer 20 is set to 1 µm. In the semiconductor device 400, the width of the contact layer 20 which is in contact with the electrode 28 is set to 4 µm. In the semiconductor device 400, the overhang portion 20a overhanging from the ridge 15 is provided on both sides of the contact layer 20. The length of the overhang portion 20a in a direction which is perpendicular to the optical axis and parallel to the upper surface of the substrate 10 is set to 1 µm.

In the second comparative example, the contact area between the contact layer 20 and the electrode 28 can be doubled as compared with the first comparative example in which the electrode is provided only on the upper surface 24 of the contact layer 20 and the overhang portion 20a is not provided. Therefore, the contact resistance can be halved as compared with the case where the overhang portion 20a is not provided.

In contrast, in the present embodiment, the side surface 26 of the contact layer 20 is also in contact with the electrode 28. Therefore, when the width of the ridge 15 is set to 2 µm, the thickness of the contact layer 20 is set to 1 µm, and the width of the contact layer 20 is set to 4 µm, the contact width between the contact layer 20 and the electrode 28 is equal to 6 µm. Therefore, the contact resistance can be reduced to ⅓ as compared with the first comparative example.

In the second comparative example, in order to obtain the same effect as the present embodiment, it is necessary to set the length of the overhang portion 20a to 2 µm. At this time, the structure may be destabilized. When the overhang portion 20a is formed by wet etching or the like, there occurs a case where the contact layer 20 is required to be thickly formed in order to lengthen the overhang portion 20a. Therefore, the production capacity of the epitaxial apparatus may be reduced.

Next, it is assumed that the width of the ridge 15 is reduced to 1 µm. In the present embodiment, when the length of the overhang portion 20a is kept to 1 µm, the width of the contact layer 20 is equal to 3 µm. Therefore, the contact width between the contact layer 20 and the electrode 28 is equal to 5 µm. Accordingly, as compared with the first comparative example, it is possible to obtain a halving effect of parasitic capacitance by halving the width of the ridge 15 while reducing the contact resistance to ⅖. As compared with the second comparative example, the halving effect of the parasitic capacitance can be obtained while reducing the contact resistance to ⅘. This effect can be obtained without lengthening the overhang portion 20a. Accordingly, the performance and reliability of the semiconductor device 100 can be enhanced at the same time as compared with the first and second comparative examples.

In the present embodiment, the contact layer 20 is formed by using the MOCVD method or ELO. According to this manufacturing method, a contact layer 20 having a flat back surface 22 is obtained. In other words, a rectangular contact layer 20 in which the width of the back surface 22 is larger than the width of the upper surface 18 of the cladding layer 14 is obtained. Here, according to this manufacturing method, the overhang portion 20a can be formed to be long without increasing the thickness of the contact layer 20. Therefore, the stress concentration on the root portion of the contact layer 20 caused by the increase of the thickness of the contact layer 20 can be prevented. Accordingly, the reliability of the semiconductor device 100 can be enhanced. Furthermore, it is possible to prevent deterioration of the production capacity of the manufacturing apparatus caused by forming the contact layer 20 to be thick.

The upper end of the insulating film 16 is provided at the same height as the upper surface 18 of the cladding layer 14. At this time, the entire surface of the side surface of the cladding layer 14 are covered with the insulating film 16. Therefore, the semiconductor layer can be protected from diffusion of the material of the electrode 28 and the like. Accordingly, the reliability of the semiconductor device 100 can be enhanced.

The semiconductor device 100 of the present embodiment is assumed to be a modulator unit. However, the semiconductor device 100 is not limited to the modulator unit, but may be a semiconductor laser or a photodiode. In the present embodiment, the ridge 15 is configured by the cladding layer 14. However, the ridge 15 is not limited to the above configuration, but may include the active layer 12.

In the present embodiment, the contact layer 20 has a rectangular shape in cross-section. However, the contact layer 20 is not limited to this configuration, and the contact layer 20 may be merely wider than the cladding layer 14. Any polygon can be adopted as the cross-sectional shape of the contact layer 20. Further, the upper surface 24, the back surface 22 and the side surface 26 of the contact layer 20 may include curved surfaces.

The electrode 28 is in contact with the entire surface of the upper surface 24 of the contact layer 20 and the entire surface of the side surface 26 of the contact layer 20. The electrode 28 is not limited to this configuration, but the electrode 28 may be in contact with the upper surface 24 of the contact layer 20 and the side surface 26 of the contact layer 20 from the upper end to the lower end of the side surface 26, and a part of the contact layer 20 may be exposed from the electrode 28.

These modifications can be applied, as appropriate, to a semiconductor device and a method for manufacturing the semiconductor device according to the following embodiments. Note that the semiconductor device and the method for manufacturing the semiconductor device according to the following embodiments are similar to those of the first embodiment in many respects, and thus differences between the semiconductor device and the method for manufacturing the semiconductor device according to the following embodiments and those of the first embodiment will be mainly described below.

Second Embodiment

Figure 5:
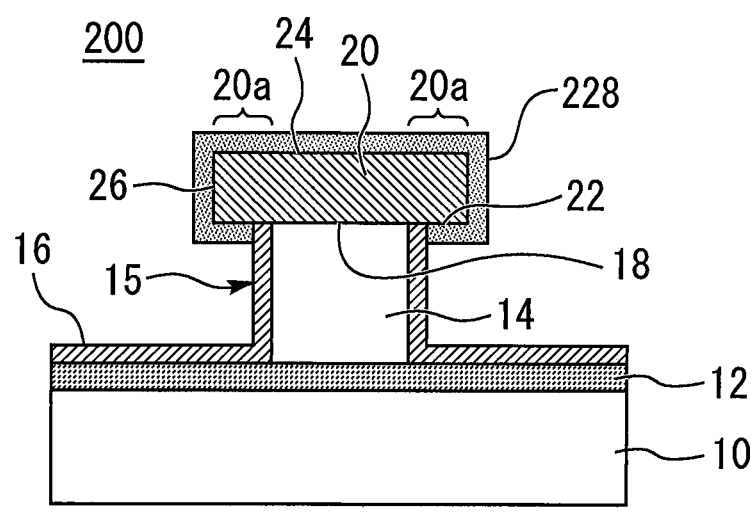
FIG. 5 is a cross-sectional view of a semiconductor device according to a second embodiment.

FIG. 5 is a cross-sectional view of a semiconductor device 200 according to a second embodiment. The semiconductor device 200 is different from the first embodiment in the structure of an electrode 228. The other structures are the same as those in the first embodiment. The electrode 228 is made of Cr and Au, for example. In the electrode 228, Cr and Au are laminated.

The electrode 228 is in contact with the back surface 22 of the contact layer 20. The electrode 228 is in contact with an entire surface of a portion of the back surface 22 of the contact layer 20, which is exposed from the insulating film 16 and the cladding layer 14.

Next, a method for manufacturing the semiconductor device 200 will be described. Up to the step of forming the contact layer 20, the process is the same as that of the first embodiment. Subsequently, the electrode 228 is formed. In the electrode 228, Cr is formed by electroless plating. The electrode 228 is formed so as to contact with the upper surface 24, the side surface 26, and the back surface 22 of the contact layer 20.

In the present embodiment, the lower portion of the overhang portion 20a is also in contact with the electrode 228. Therefore, the contact area can be made larger than that in the first embodiment.

For example, the width of the ridge 15 is set to 2 µm, the thickness of the contact layer 20 is set to 1 µm, the width of the contact layer 20 is set to 4 µm, and the thickness of a portion of the insulating film 16 which covers the side surface of the cladding layer 14 is set to 0.5 µm. The length of the overhang portion in the direction perpendicular to the optical axis and parallel to the upper surface of the substrate 10 is set to 1 µm. Here, the length of the overhang portion 20a is the length of the portion of the contact layer 20 that protrudes with respect to the cladding layer 14.

At this time, the contact width between the contact layer 20 and the electrode 228 is equal to 7 µm. Therefore, the contact resistance can be reduced to 2/7 as compared with a case where the electrode is provided only on the upper surface of the contact layer and no overhang portion is provided.

By forming the electrode 228 using electroless plating, the back surface 22 of the contact layer 20 can be surely covered with the electrode 228 as compared with vapor deposition lift-off or sputtering.

In the present embodiment, the electrode 228 is in contact with the entire surface of a portion of the back surface 22 of the contact layer 20, which is exposed from the insulating film 16 and the cladding layer 14. The electrode 228 is not limited to this configuration, but may be in contact with a part of the back surface 22 of the contact layer 20, which is exposed from the insulating film 16 and the cladding layer 14. Note that the technical features described in the above embodiments may be combined as appropriate.

REFERENCE SIGNS LIST 100, 200 semiconductor device, 10 substrate, 12 active layer, 14 cladding layer, 16 insulating film, 18 upper surface, 20 contact layer, 22 back surface, 24 upper surface, 26 side surface, 28, 228 electrode

The invention claimed is:
1. A semiconductor device comprising:
a substrate;
an active layer provided on the substrate;
a cladding layer provided on the active layer;
an insulating film covering a side surface of the cladding layer and an upper surface of the active layer;
a contact layer provided on the cladding layer, the contact layer having an upper surface, a back surface which is a surface on an opposite side to the upper surface and is at a same height as an upper end of the cladding layer, and a side surface connecting the upper surface and the back surface, the contact layer is larger in width than a total width of the cladding layer and the insulating film and includes an overhang portion that protrudes from an upper surface of the cladding layer beyond the insulating film; and an electrode that is in contact with the upper surface of the contact layer and the side surface of the contact layer from an upper end to a lower end of the side surface of the contact layer and does not contact the insulating film on a portion of the upper surface of the active layer at which the cladding layer is not provided.

2. The semiconductor device according to claim 1, wherein the electrode is in contact with an entire surface of the upper surface of the contact layer and an entire surface of the side surface of the contact layer.

3. The semiconductor device according to claim 1, wherein an upper end of the insulating film is provided at a same height as the upper surface of the cladding layer.

4. The semiconductor device according to claim 1, wherein a width of the back surface of the contact layer is larger than a width of the upper surface of the cladding layer.

5. The semiconductor device according to claim 1, wherein the electrode is in contact with the back surface of the contact layer.

6. The semiconductor device according to claim 3, wherein the electrode is in contact with an entire surface of a portion of the back surface of the contact layer, the portion being exposed from the insulating film and the cladding layer.

7. The semiconductor device according to claim 1, wherein the back surface of the contact layer is parallel to an upper surface of the substrate.

8. A method for manufacturing a semiconductor device comprising the steps of:
    forming an active layer on a substrate;
    forming a cladding layer on the active layer;
    forming a contact layer on the cladding layer, the contact layer having an upper surface, a back surface which is a surface on an opposite side to the upper surface and is at a same height as an upper end of the cladding layer, and a side surface connecting the upper surface and the back surface, the contact layer being larger in width than the cladding layer;
    forming an insulating film in such a manner that the insulating film covers a side surface of the cladding layer and an upper surface of the active layer; and
    forming an electrode by electroless plating in such a manner that the electrode contacts the upper surface, the side surface and the back surface of the contact layer, and does not contact the insulating film on a portion of the upper surface of the active layer at which the cladding layer is not provided,
    the contact layer is larger in width than a total width of the cladding layer and the insulating film and includes an overhang portion that protrudes from an upper surface of the cladding layer beyond the insulating film.

* * * * *